(12) United States Patent
Li et al.

(10) Patent No.: US 11,616,383 B2
(45) Date of Patent: Mar. 28, 2023

(54) DEVICE AND METHOD FOR GENERATING MAGNITUDE AND RATE OFFSETS AT A PHASE COMPARATOR

(71) Applicant: Renesas Electronics America Inc., Milpitas, CA (US)

(72) Inventors: Yang Li, Fremont, CA (US); Sungkeun Lim, Cary, NC (US); Zhigang Liang, Fremont, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 292 days.

(21) Appl. No.: 17/111,304

(22) Filed: Dec. 3, 2020

(65) Prior Publication Data

US 2021/0175734 A1 Jun. 10, 2021

Related U.S. Application Data

(60) Provisional application No. 62/944,594, filed on Dec. 6, 2019.

(51) Int. Cl.
| | |
|---|---|
| *H03K 5/003* | (2006.01) |
| *H02J 7/00* | (2006.01) |
| *H03K 5/26* | (2006.01) |
| *H02M 1/00* | (2006.01) |
| *H02M 3/156* | (2006.01) |
| *H02J 1/00* | (2006.01) |

(52) U.S. Cl.
CPC ....... *H02J 7/00712* (2020.01); *H02M 1/0016* (2021.05); *H02M 3/1566* (2021.05); *H03K 5/003* (2013.01); *H03K 5/26* (2013.01); *H02J 1/001* (2020.01); *H02J 7/007* (2013.01)

(58) Field of Classification Search
CPC ........ H02J 7/00712; H02J 1/001; H02J 7/007; H02M 1/0016; H02M 3/1566; H03K 5/003; H03K 5/26
See application file for complete search history.

(56) References Cited

U.S. PATENT DOCUMENTS

| | | | | |
|---|---|---|---|---|
| 6,801,146 B2 * | 10/2004 | Kernahan | ............. | H03L 7/0996 341/122 |
| 6,819,011 B2 * | 11/2004 | Kernahan | ........... | H02M 1/0845 307/151 |
| 10,389,166 B1 * | 8/2019 | Sahoo | ................... | H02M 7/219 |

* cited by examiner

*Primary Examiner* — Adolf D Berhane
(74) *Attorney, Agent, or Firm* — Foley & Lardner LLP

(57) ABSTRACT

Example implementations include a method of obtaining an input voltage of a power converter circuit and a system voltage of the power converter circuit, obtaining a voltage rate gain based on an aggregate inductance of the power converter circuit, and in accordance with a determination that the input voltage and the system voltage are not equal, generating a rate offset voltage based on the voltage rate gain and the system voltage difference. Example implementations also include a device with a rate predictor device operatively coupled to an input voltage node and a system voltage node, and configured to obtain an input voltage of a power converter circuit and a system voltage of the power converter circuit, configured to obtain a voltage rate gain based on an aggregate inductance of the power converter circuit, and configured to, in accordance with a determination that the input voltage and the system voltage are not equal, generate a rate offset voltage based on the voltage rate gain and the system voltage difference.

20 Claims, 5 Drawing Sheets

US 11,616,383 B2

DEVICE AND METHOD FOR GENERATING MAGNITUDE AND RATE OFFSETS AT A PHASE COMPARATOR

CROSS-REFERENCE TO RELATED PATENT APPLICATIONS

This application claims priority to U.S. Provisional Patent Application Ser. No. 62/944,594, entitled "PHASE COMPARATOR," filed Dec. 6, 2019, the contents of such application being hereby incorporated by reference in its entirety and for all purposes as if completely and fully set forth herein.

TECHNICAL FIELD

The present implementations relate generally to electrical chargers, and more particularly to generating magnitude and rate offsets at a phase comparator device.

BACKGROUND

Consistent power delivery in environments with rapidly changing power requirements is increasingly critical to operations of systems including electrical and electronic components. As one example, electronic computing systems are subject to rapid and unpredictable changes in power and load requirements responsive to "hot-swapping" peripheral devices with respect to power sources. However, conventional systems may not effectively manage changes in magnitude and rate of voltage to maintain consistent power characteristics for a system load. Thus, a technological solution for generating magnitude and rate offsets at a phase comparator device is desired.

SUMMARY

Example implementations include a method of obtaining an input voltage of a power converter circuit and a system voltage of the power converter circuit, obtaining a voltage rate gain based on an aggregate inductance of the power converter circuit, and in accordance with a determination that the input voltage and the system voltage are not equal, generating a rate offset voltage based on the voltage rate gain and the system voltage difference.

Example implementations also include a device with a rate predictor device operatively coupled to an input voltage node and a system voltage node, and configured to obtain an input voltage of a power converter circuit and a system voltage of the power converter circuit, configured to obtain a voltage rate gain based on an aggregate inductance of the power converter circuit, and configured to, in accordance with a determination that the input voltage and the system voltage are not equal, generate a rate offset voltage based on the voltage rate gain and the system voltage difference.

Example implementations also include a device with a rate predictor device including a memory device and operatively coupled to an input voltage node and a system voltage node, and configured to obtain an input voltage of a power converter circuit and a system voltage of the power converter circuit, configured to obtain a voltage rate gain from the memory device based on an aggregate inductance of the power converter circuit, and configured to, in accordance with a determination that the input voltage and the system voltage are not equal, generate a rate offset voltage based on the voltage rate gain and the system voltage difference, and a comparator having a rate offset input operatively coupled to the rate predictor device and configured to receive the rate offset voltage at the rate offset input.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
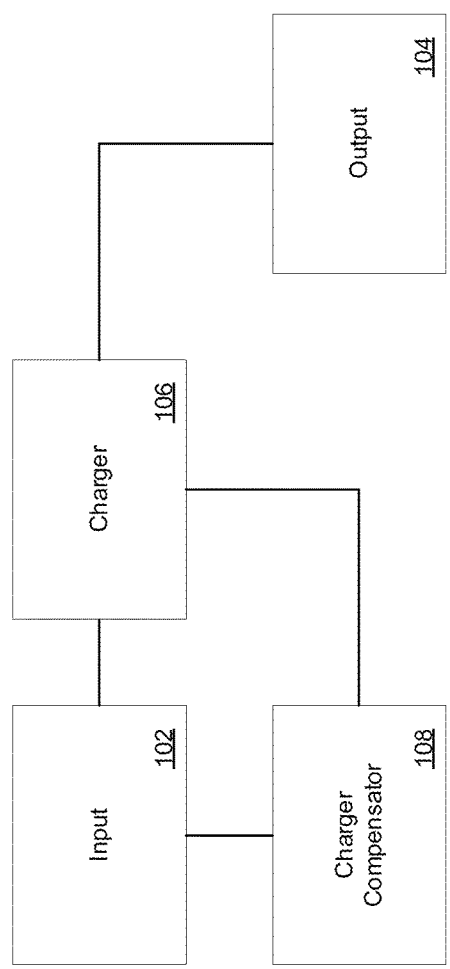
FIG. 1 illustrates an example system, in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

It is to be understood that phase comparator systems can be subject to voltage variation based on load variance. As one example, change in load due to connection and disconnection of electronic devices drawing various levels of power can impact operation of an example phase comparator device. To continue and maintain consistent operation in view of changes to load conditions, an example phase comparator is able to compensate for such changes by modifying at least an output compensation voltage generated by the phase comparator. In some implementations, a phase comparator according to present implementations is operable to compensate for variation in both magnitude and rate of change of currents or voltages thereof to maintain consistent system voltage. It is to be further understood that an example phase comparator is operable in a discontinuous conduction mode (DCM), and that variation in system voltage or other internal voltages thereof can disrupt operation of the phase comparator, including dropping the phase comparator out of DCM and into continuous conduction mode (CCM). Thus, in some implementations, the example phase comparator device and system in accordance with present implementations is operable to compensate based on rate of change in current or voltage alone, or rate of change in current or voltage with magnitude of change of current or voltage.

FIG. 1 illustrates an example system, in accordance with present implementations. As illustrated by way of example in FIG. 1, an example system 100 includes an input 102, an output 104, a charger 106, a charger compensator 108, and a phase comparator 110.

The input 102 is, includes, or is operably coupleable to a source of electrical power, voltage, current, or the like for supplying power to the system 100. In some embodiments, the input 102 includes, but is not limited to regulated 120 V AC power, regulated 220V AC power, 5V DC power, 12V DC power, or the like. In some implementations, the input 102 comprises a wired power connection, a wireless direct contact power connection, a wireless and contactless power connection, the like. In some implementations, the input 102 comprises one or more USB terminals or ports (e.g., USB-C, USB-PD).

The output 104 is, includes, or is operably coupleable to one or more electrical, electronic, electromechanical, electrochemical, or like devices or systems for receiving power, voltage, current, or the like from the charger 106 to perform one or more actions. In some implementations, the output 104 includes at least one battery, electronic display, electronic computer, electronic input device, electromechanical input device, electronic output device, electromechanical output device or the like. Examples of these devices include notebook computers, desktop computers, tablets, smartphones, printers, scanners, telephony endpoints, videoconferencing endpoints, keyboards, mice, trackpads, gaming peripherals, monitors, televisions, and the like. In some implementations, the output 104 includes one or more devices partially or fully separable from the system 100. In some implementations, the output 104 includes one or more devices partially or fully integrated or integrable into, or separable from, the system 100.

The charger 106 is or includes one or more electrical, electronic, electromechanical, electrochemical, or like devices or systems for charging the output 104. In some implementations, the charger 106 is or includes an inductive charger. In some implementations, an inductive charger is a buck charger, a boost charger, a buck-boost charger, a combination thereof, or the like.

The charger compensator 108 is operable to apply one or more compensating electrical outputs in response to feedback received from at least one of the input 102, the output 104, and the charger 106. In some implementations, the charger compensator 108 includes one or more analog or digital logical or electronic devices including but not limited to operational amplifiers, comparators, integrated circuits, logic gates, flip flops, gate arrays, programmable gate arrays, and the like. It is to be understood that any electrical, electronic, or like devices, or components associated with the charger compensator 108 can also be associated with, integrated with, integrable with, replaced by, supplemented by, complemented by, or the like, a system processor or any component thereof.

The system processor is operable to execute one or more instructions associated with input from the at least one of the input 102, the output 104, and the charger 106. In some implementations, the system processor is an electronic processor, an integrated circuit, or the like including one or more of digital logic, analog logic, digital sensors, analog sensors, communication buses, volatile memory, nonvolatile memory, and the like. In some implementations, the system processor includes but is not limited to, at least one microcontroller unit (MCU), microprocessor unit (MPU), central processing unit (CPU), graphics processing unit (GPU), physics processing unit (PPU), embedded controller (EC), or the like. In some implementations, the system processor includes a memory operable to store or storing one or more instructions for operating components of the system processor and operating components operably coupled to the system processor. In some implementations, the one or more instructions include at least one of firmware, software, hardware, operating systems, embedded operating systems, and the like.

Figure 2:
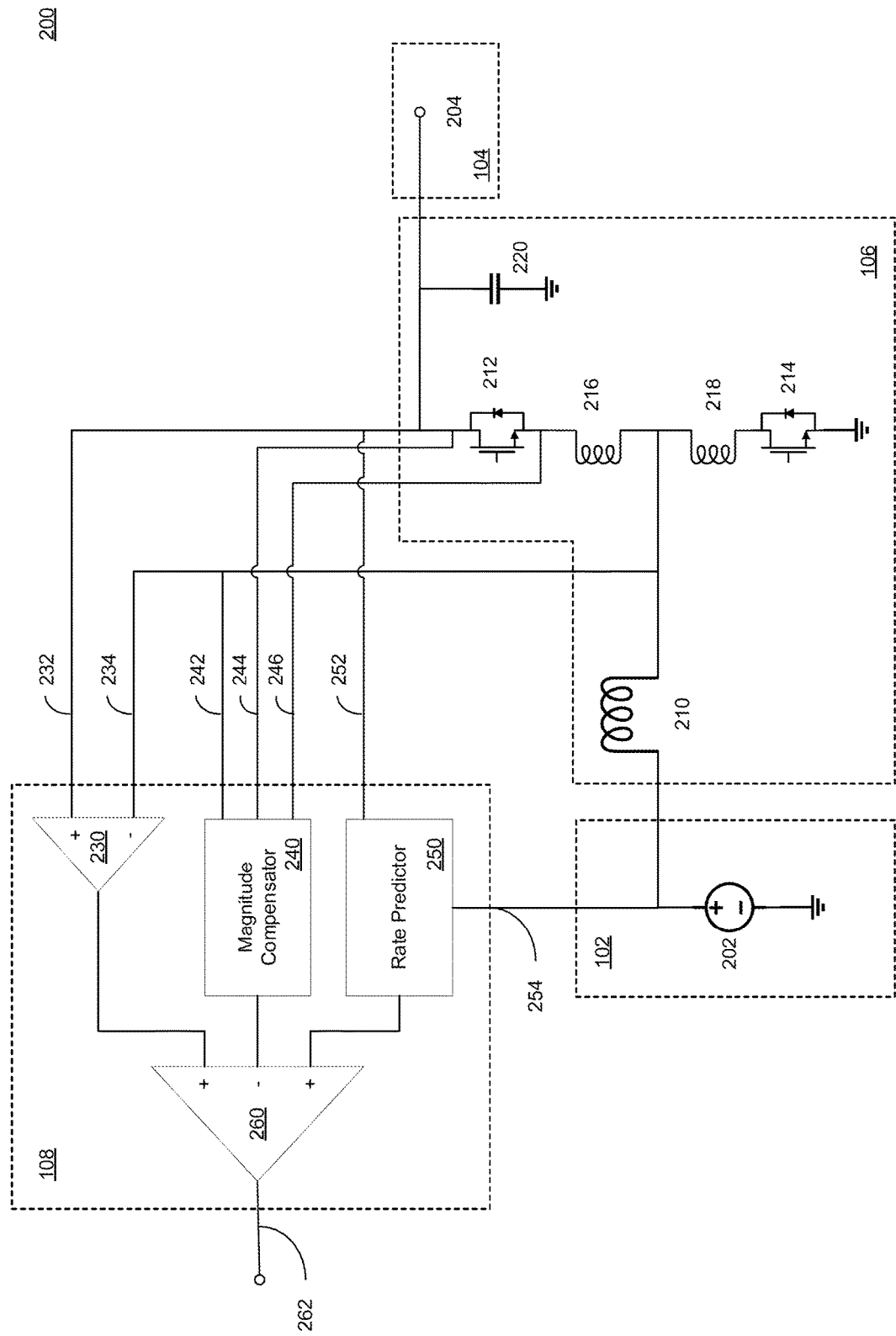
FIG. 2 illustrates an example phase comparator device, in accordance with present implementations.

FIG. 2 illustrates an example phase comparator device, in accordance with present implementations. As illustrated by way of example in FIG. 2, an example phase comparator device 200 includes the input 102, the output 104, the charger 106, and the charger compensator 108.

In some implementations, the input 102 includes voltage source 202. In some implementations, the input 102 is operatively coupled to the charger compensator by the input feedback line 258. In some implementations, the output 104 includes output node 204.

The voltage source 202 is operable to supply at least one input voltage including at least one of a direct current (DC) and an alternating current (AC) voltage. In some implementations, the voltage source is operatively coupled to at least one of an input of the inductor 210 and an input of the rate predictor 250.

In some implementations, the charger 106 includes inductor 210, high-side boost transistor Q4 212, low-side boost transistor Q3 214, and output capacitor 220. In some implementations, the high-side boost transistor Q4 212 has an inductance 216, and the low-side boost transistor Q3 214 has an inductance 218.

The inductor 210 is replaceable, configurable, selectable, or the like to have a particular inductance for satisfying a particular power requirement of at least one of the charger 106 and the charger compensator 108. In some implementations, the inductor 210 is replaceable to have a particular inductance compatible with a gain ratio associated with the rate predictor 250. In some implementations, the inductor 210 is replaceable to have a particular inductance satisfying a gain ratio associated with the rate predictor 250. In some implementations, a rate of change of current at the inductor 210 is described by Equation 1, where VSYS is output voltage at the output node, $V_{in}$ is input voltage at the voltage source 202, L is inductance at the inductor 210, and $$\frac{di}{dt}$$

is a rate of change of current:

$$V_{sys} - V_{in} = L\frac{di}{dt} \qquad \text{Eq. (1)}$$

The high-side boost transistor Q4 212 is operatively coupled to the output node 204 and the inductor 210. The low-side boost transistor Q3 214 is operatively coupled to the inductor 210 and a ground node. In some implementations, the high-side boost transistor Q4 212 and the low-side boost transistor Q3 214 are field effect transistors, metal oxide semiconductor field effect transistors (MOSFETS), or the like. In some implementations, the inductor 210, the high-side boost transistor Q4 212 and the low-side boost transistor Q3 214 are arranged in a boost mode DC-DC converter. The inductances 216 and 218 are parasitic inductances associated respectively with the high-side boost transistor Q4 212 and the low-side boost transistor Q3 214.

In some implementations, a rate of change of current at the high-side boost transistor Q4 212 is described by Equation 2, where VLs is a parasitic voltage at the high-side boost transistor Q4 212, Ls is a parasitic inductance at the high-side boost transistor Q4 212, and $$\frac{di}{dt}$$

is a rate of change of current:

$$V_{Ls} = L_s \frac{di}{dt} \qquad \text{Eq. (2)}$$

In some implementations, the charger compensator 108 includes system voltage comparator 230, magnitude compensator 240, rate predictor 250, and compensation generator 260.

The system voltage comparator 230 is operable to determine a difference between a system voltage and an inductor output voltage. In some implementations, the system voltage is or is equivalent to a voltage at the output 104. In some implementations, the inductor output voltage is or is equivalent to a voltage at an inductor output node. In some implementations, the inductor output node is operatively coupled to a boost-side terminal of the inductor 210. In some implementations, the inductor output node is directly or operatively coupled to the inductor 210, the high-side boost transistor Q4 and the low-side boost transistor 214. In some implementations, the system voltage comparator 230 is or includes an operational amplifier. In some implementations, the system voltage comparator 230 receives the system voltage at a noninverting input and receives the inductor output voltage at an inverting input. Thus, in some implementations, the system voltage comparator is operable to subtract the input voltage from the system voltage.

In some implementations, the system voltage comparator 230 includes one or more analog or digital logical or electronic devices including but not limited to operational amplifiers, comparators, integrated circuits, logic gates, flip flops, gate arrays, programmable gate arrays, and the like. It is to be understood that any electrical, electronic, or like devices, or components associated with the system voltage comparator 230 can also be associated with, integrated with, integrable with, replaced by, supplemented by, complemented by, or the like, a system processor or any component thereof. In some implementations, the system voltage comparator 230 is operatively coupled to the output node 204 by system output feedback line 232 and to the inductor 210 by inductor output feedback line 234.

The magnitude compensator 240 is operable to apply an offset voltage based on a difference between the system voltage and the inductor output voltage and a voltage drop across the high-side boost transistor Q4 212. In some implementations, the magnitude compensator 240 is operable to apply a positive offset voltage upon a first voltage condition, and to apply a negative offset voltage upon a second voltage condition. In some implementations, the first voltage condition is satisfied when the inductor output voltage is less than the system voltage. In some implementations, the magnitude compensator is operable to apply voltages at one or more discrete voltage levels defined by a counter, adder, or the like including one or more bits indicating particular voltage levels, steps, or the like. In some implementations, the second voltage condition is satisfied when the inductor output voltage equals the system voltage plus a voltage drop across the high-side boost transistor Q4 212. In some implementations, the magnitude compensator 240 is responsive to feedback subject to a delay. In some implementations, the delay is up to 32 switching cycles of the charger 106.

In some implementations, the magnitude compensator 240 includes one or more analog or digital logical or electronic devices including but not limited to operational amplifiers, comparators, integrated circuits, logic gates, flip flops, gate arrays, programmable gate arrays, and the like. It is to be understood that any electrical, electronic, or like devices, or components associated with the magnitude compensator 240 can also be associated with, integrated with, integrable with, replaced by, supplemented by, complemented by, or the like, a system processor or any component thereof. In some implementations, the magnitude compensator 240 is operatively coupled to the inductor 210 by inductor output feedback line 242, to a high-side of the high-side transistor Q4 212 by the high-side transistor feedback line 244, and to a low-side of the high-side transistor Q4 212 by the low-side transistor feedback line 246. In some implementations, the magnitude compensator detects the voltage drop across the high-side boost transistor Q4 212 by the detecting and differencing voltages at the high-side transistor feedback line 244 and the low-side transistor feedback line 246.

The rate predictor 250 is operable to apply an offset voltage based on a rate of change of current through the high-side boost transistor 212 at the output of the charger 106. In some implementations, the rate predictor includes a nonvolatile memory, register, flip flop, gate array, programmable gate array, or the like operable to store at least one value of a gain K. In some implementations, the gain K is predetermined to identify, indicate, support, or be compatible with a particular inductance of the inductor 210. In some implementations, the gain K stores a ratio of an inductance of the inductor 210 and a parasitic inductance of the high-side boost transistor 212. In some implementations, the rate predictor 250 includes one or more analog or digital logical or electronic devices including but not limited to operational amplifiers, comparators, integrated circuits, logic gates, flip flops, gate arrays, programmable gate arrays, and the like. In some implementations, the rate predictor 250 is instantaneously responsive to changes in rate of current, voltage and the like to generate an offset voltage. It is to be understood that any electrical, electronic, or like devices, or components associated with the rate predictor 250 can also be associated with, integrated with, integrable with, replaced by, supplemented by, complemented by, or the like, a system processor or any component thereof. In some implementations, the rate predictor 250 is operatively coupled to the output node by system output feedback line 252, and to the voltage source 202 by system input feedback line 254. In some implementations, the rate predictor is operable to store, and retrieve the gain K based at least partially on inductance of the inductor 210 and parasitic inductance of the high-side boost transistor Q4 212, as described by Equations 1 and 2. In some implementations, a relationship between parasitic voltage VLs, system voltage VSYS, input voltage Vin, the inductance of the inductor 210 and the parasitic inductance of the high-side boost transistor Q4 212 is described by Equation 3, and the gain K is described by Equation 4:

$$V_{Ls} = \frac{L_s}{L}(V_{sys} - V_{in}) \qquad \text{Eq. (3)}$$

$$V_{Ls} = K(V_{sys} - V_{in}), \text{ where } \frac{L_s}{L} = K \qquad \text{Eq. (4)}$$

The compensation generator 260 is operable to arithmetically combine one or more voltage values or offsets and to generate a total offset voltage. In some implementations, the compensation generator 260 includes one or more analog or digital logical or electronic devices including but not limited to operational amplifiers, comparators, integrated circuits, logic gates, flip flops, gate arrays, programmable gate arrays, and the like. It is to be understood that any electrical, electronic, or like devices, or components associated with the compensation generator 260 can also be associated with, integrated with, integrable with, replaced by, supplemented by, complemented by, or the like, a system processor or any component thereof. In some implementations, a first noninverting input of the compensation generator 260 is operatively coupled to an output of the system voltage comparator 230, an inverting input of the compensation generator 260 is operatively coupled to an output of the magnitude compensator 240, and a second noninverting input of the compensation generator 260 is operatively coupled to an output of the rate predictor 250. In some implementations, an output of the compensation generator 262 is operatively coupled to control logic operable to drive at least one or more of the transistors 212 and 214 in accordance with present implementations.

Figure 3:
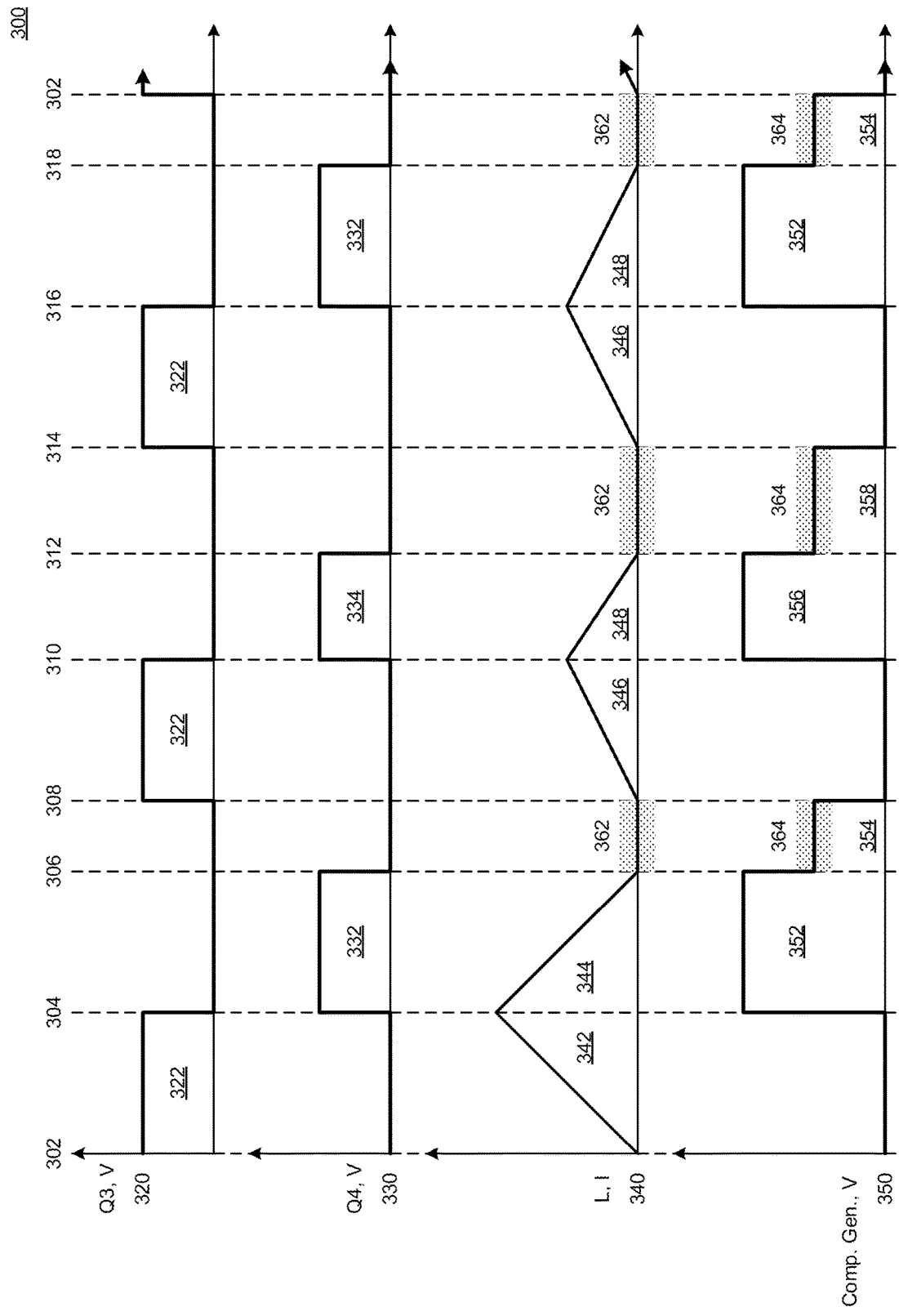
FIG. 3 illustrates an example timing diagram for an example phase comparator device, in accordance with present implementations.

FIG. 3 illustrates an example timing diagram for an example phase comparator device, in accordance with present implementations. As illustrated by way of example in FIG. 3, an example timing diagram 300 includes low-side boost transistor Q3 voltage timing waveform 320, high-side boost transistor Q4 voltage timing waveform 330, inductor L current timing waveform 340, and compensation generator voltage timing waveform 350. In some implementations, at least one of the example system 100 and the example device 200 performs operates according to the example timing diagram 300. In some implementations, the example phase comparator device begins operation in a discontinuous conduction mode (DCM). In some implementations, the example phase comparator device begins operation at time 302 of the example timing diagram 300. In some implementations, the low-side boost transistor Q3, the high-side boost transistor Q4, the inductor L, and the compensation generator respectively correspond to the transistor 214, the transistor 212, the inductor 210, and the compensation generator 260. In accordance with present implementations, the example phase comparator device includes operation by magnitude compensator 240 and the rate predictor 250 to achieve operation in accordance with example timing diagram 300.

In some implementations, the phase comparator device is operable at least at a low DCM voltage approximately equal to zero, a discrete DCM voltage greater than zero, and a jittered DCM voltage greater than the low DCM voltage and less than the discrete DCM voltage. In some implementations, the discrete DCM voltage is stable at a first voltage level. In some implementations, the discrete DCM voltage is stable at a DC voltage level. In some implementations, the discrete DCM voltage is higher at least on average than the jittered DCM voltage. In some implementations, the jittered DCM voltage is variable within a predetermined range of a second voltage level. In some implementations, the first voltage level is higher than the second voltage level. In some implementations, an average of the first voltage level is higher than an average of the second voltage level. In some implementations, the average of one or more of the first voltage and the second voltage is a mean voltage, root-mean-square voltage (VRMS), or the like.

At time 302, transistor Q3 begins pulse 322 having a high voltage state at or above an activation voltage of the transistor Q3. Concurrently, transistor Q4 is between pulses and has a low voltage state below an activation voltage of the transistor Q4. In response to the states of transistors Q3 and Q4 at 302, inductor L increases current I therethrough along ramp 342 towards a first peak current. Concurrently, the compensation generator is between pulses and has a low DCM voltage. In some implementations, the transistors Q3 and Q4 switch concurrently, simultaneously, or the like into their respective high and low states at time 302.

At time 304, transistor Q3 ends pulse 322 and enters a low voltage state below the activation voltage of the transistor Q3. Concurrently, transistor Q4 begins its first pulse 332 and enters a high voltage state at or above the activation voltage of the transistor Q4. In response to the states of transistors Q3 and Q4 at 304, inductor L decreases current I therethrough along ramp 344 towards zero current from its first peak current. In some implementations, the inductor L reaches its first peak current at time 304, at a transition between a first charge period ending at time 304 and a first discharge period beginning at time 304. Concurrently, the compensation generator begins a first DCM pulse 352 and has a voltage state corresponding to the discrete DCM voltage. In some implementations, the transistors Q3 and Q4 switch concurrently, simultaneously, or the like into their respective low and high states at time 304. In some implementations, the period between times 302 and 304 has a first duration in accordance with operation of the charger 106 in at least one of a buck mode, a boost mode, and a buck-boost mode. In some implementations, the period between times 302 and 304 corresponds to a length of the pulse 322.

At time 306, transistor Q3 remains in a low voltage state below the activation voltage of the transistor Q3. Concurrently, transistor Q4 enters the low voltage state below the activation voltage of the transistor Q4. In response to the states of transistors Q3 and Q4 at 306, inductor L decreases current I towards zero current from its first peak current, and maintains a low inductor current 362 substantially equal to zero. In some implementations, the low inductor current 362 varies within a predetermined range centered on zero voltage. In some implementations, the inductor L reaches its first zero current at time 306, at a transition between a first discharge period ending at time 306 and a first discontinuous period beginning at time 306. Concurrently, the compensation generator begins a second DCM pulse 354 and has a voltage state corresponding to the jittered DCM voltage. In some implementations, the period between times 304 and 306 has a duration corresponding in length to the first duration. In some implementations, the period between times 304 and 306 corresponds to a length of time between the pulses 332 and 322.

At time 308, transistor Q3 begins a second pulse 322 and enters its high voltage state. Concurrently, transistor Q4 remains in its low voltage state. In response to the states of transistors Q3 and Q4 at 308, inductor L increases current I along ramp 346 towards a second peak current. Concurrently, the compensation generator ends the second DCM pulse and has a voltage state corresponding to the low DCM voltage. In some implementations, the period between times 306 and 308 has a second duration shorter than the first duration. In some implementations, the period between times 306 and 306 corresponds to a length of the pulse 322.

At time 310, transistor Q3 ends pulse 322 and enters its low voltage state. Concurrently, transistor Q4 begins its second pulse 334 and enters its high voltage state. In response to the states of transistors Q3 and Q4 at 310, inductor L decreases current I therethrough along ramp 348 towards zero current from its second peak current. In some implementations, the inductor L reaches its second peak current at time 310, at a transition between a second charge period ending at time 310 and a second discharge period beginning at time 310. Concurrently, the compensation generator begins a third DCM pulse 356 and has a voltage state corresponding to the discrete DCM voltage. In some implementations, the third DCM pulse has a period shorter than the period corresponding to the first DCM pulse 352. Here, the shorter second DCM pulse 356 is responsive to the shorter Q4 pulse 334, where the longer first DCM pulse 352 is responsive to the correspondingly longer Q4 pulse 332. In some implementations, the transistors Q3 and Q4 switch concurrently, simultaneously, or the like into their respective low and high states at time 310. In some implementations, the period between times 308 and 310 has the first duration. In some implementations, the period between times 308 and 310 corresponds to a length of the second pulse 322.

At time 312, transistor Q3 remains in its low voltage state. Concurrently, transistor Q4 enters its low voltage state. In response to the states of transistors Q3 and Q4 at 312, inductor L decreases current I towards zero current from its second peak current, and maintains a low inductor current 362 substantially equal to zero. In some implementations, the low inductor current 362 varies within a predetermined range centered on zero voltage. In some implementations, the inductor L reaches its second zero current at time 312, at a transition between a second discharge period ending at time 312 and a second discontinuous period beginning at time 312. Concurrently, the compensation generator begins a fourth DCM pulse 358 and has a voltage state corresponding to the jittered DCM voltage. In some implementations, the period between times 310 and 312 has a third duration shorter than the first duration and longer than the second duration. In some implementations, the period between times 310 and 312 corresponds to a length of time between the pulses 334 and 322. In some implementations, the third duration is longer than the second duration in response to the shortened pulse 334 preceding pulse 358, as compared to the longer pulse 332 preceding pulse 354.

At time 314, transistor Q3 begins a third pulse 322 and enters its high voltage state. Concurrently, transistor Q4 remains in its low voltage state. In response to the states of transistors Q3 and Q4 at 314, inductor L increases current I along ramp 346 towards the second peak current. Concurrently, the compensation generator ends the fourth DCM pulse and has a voltage state corresponding to the low DCM voltage. In some implementations, the period between times 312 and 314 has the third duration. In some implementations, the period between times 312 and 314 corresponds to a length of time of the pulse 322.

At time 316, transistor Q3 ends pulse 322 and enters its low voltage state. Concurrently, transistor Q4 begins its third pulse 332 and enters its high voltage state. In response to the states of transistors Q3 and Q4 at 316, inductor L decreases current I therethrough along ramp 348 towards zero current from its second peak current. In some implementations, the inductor L reaches its second peak current at time 316, at a transition between a third charge period ending at time 316 and a third discharge period beginning at time 316. Concurrently, the compensation generator begins a fifth DCM pulse 352 and has a voltage state corresponding to the discrete DCM voltage. In some implementations, the transistors Q3 and Q4 switch concurrently, simultaneously, or the like into their respective low and high states at time 316. In some implementations, the period between times 314 and 316 has the first duration. In some implementations, the period between times 314 and 316 corresponds to a length of the pulse 322.

At time 318, the example phase comparator device operates in accordance with its operation at time 306. After time 318, the example phase comparator device continues operation in a loop. In some implementations, the loop corresponds to cyclic operation of an inductive charger in at least one of a buck mode, a boost mode, and a buck-boost mode. In some implementations, the example phase comparator device operates cyclically by entering a state corresponding to at least one of times 302, 308, and 314.

Figure 4:
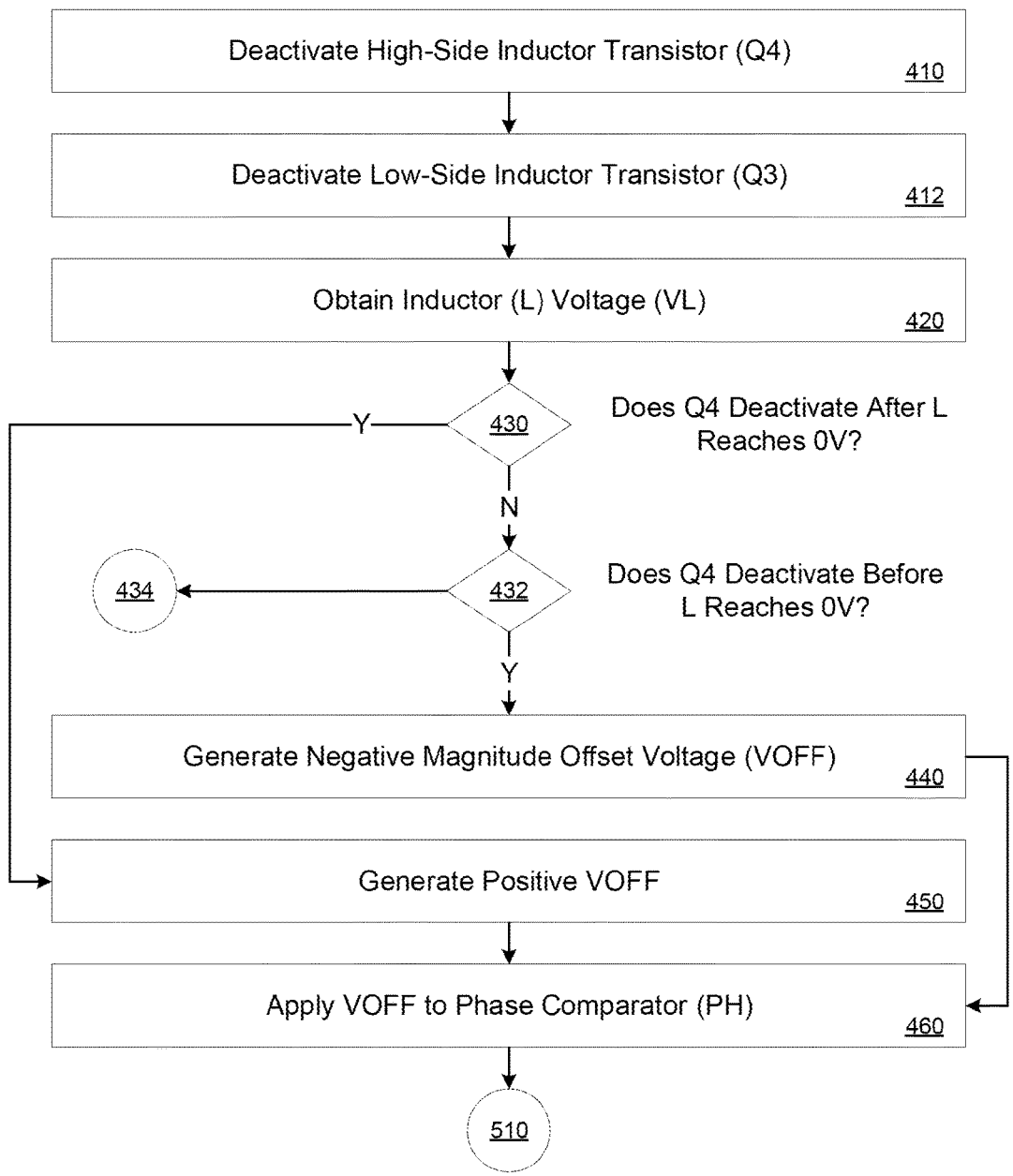
FIG. 4 illustrates an example method of compensating a phase comparator voltage, in accordance with present implementations.

FIG. 4 illustrates an example method of compensating a phase comparator voltage, in accordance with present implementations. In some implementations, at least one of the example system 100 and the example device 200 performs method 400 according to present implementations. In some implementations, the method 400 begins at step 410.

At step 410, the example system deactivates high-side inductor transistor Q4. In some implementations, the charger 106 deactivates the high-side inductor transistor Q4 212 in accordance with a buck mode, a boost mode, or a buck-boost mode of operation electronically controlled thereby. The method 400 then continues to step 412. At step 412, the example system deactivates a low-side inductor transistor Q3. In some implementations, the charger 106 deactivates the low-side inductor transistor Q3 214 in accordance with a buck mode, a boost mode, or a buck-boost mode of operation electronically controlled thereby. The method 400 then continues to step 420. At step 420, the example system obtains inductor voltage IL at inductor L. In some implementations, the inductor L is the inductor 210. In some implementations, the system voltage comparator 230 and the magnitude compensator 240 obtain the inductor voltage IL at respective inputs thereof respectively by feedback lines 242 and 252. The method 400 then continues to step 430.

At step 430, the example system determines whether Q4 deactivates after L reaches 0 V. In some implementations, the charger compensator 108 determines whether Q4 deactivates after L reaches 0 V by determining whether the first voltage condition is satisfied. In accordance with a determination that Q4 deactivates after L reaches 0 V, the method 400 continues to step 450. Alternatively, in accordance with a determination that Q4 does not deactivate after L reaches 0 V, the method 400 continues to step 432. At step 432, the example system determines whether Q4 deactivates before L reaches 0 V. In some implementations, the charger compensator 108 determines whether Q4 deactivates before L reaches 0 V by determining whether the second voltage condition is satisfied. In accordance with a determination that Q4 deactivates before L reaches 0 V, the method 400 continues to step 440. Alternatively, in accordance with a determination that Q4 does not deactivate before L reaches 0 V, the method 400 continues to step 434. At step 434, the example system blocks, forgoes, or the like, generating any offset voltage at the example system. In some implementations, neither the magnitude compensator 240 nor the rate predictor 250 generate any offset voltage or value based on operation of the example system in step 434. In some implementations, the method 400 ends at step 434.

At step 440, the example system generates a negative magnitude offset voltage VOFF. In some implementations, at least one of the charger compensator 108 and the magnitude compensator 240 generates the negative magnitude offset voltage VOFF. The method 400 then continues to step 460. At step 450, the example system generates a positive magnitude offset voltage VOFF. In some implementations, at least one of the charger compensator 108 and the magnitude compensator 240 generates the positive magnitude offset voltage VOFF. The method 400 then continues to step 460. At step 460, the example system applies the offset voltage VOFF to the phase comparator. In some implementations, the magnitude compensator 240 outputs the positive or negative offset voltage VOFF to an inverting input of the compensation generator 260. The method 400 then continues to step 510.

Figure 5:
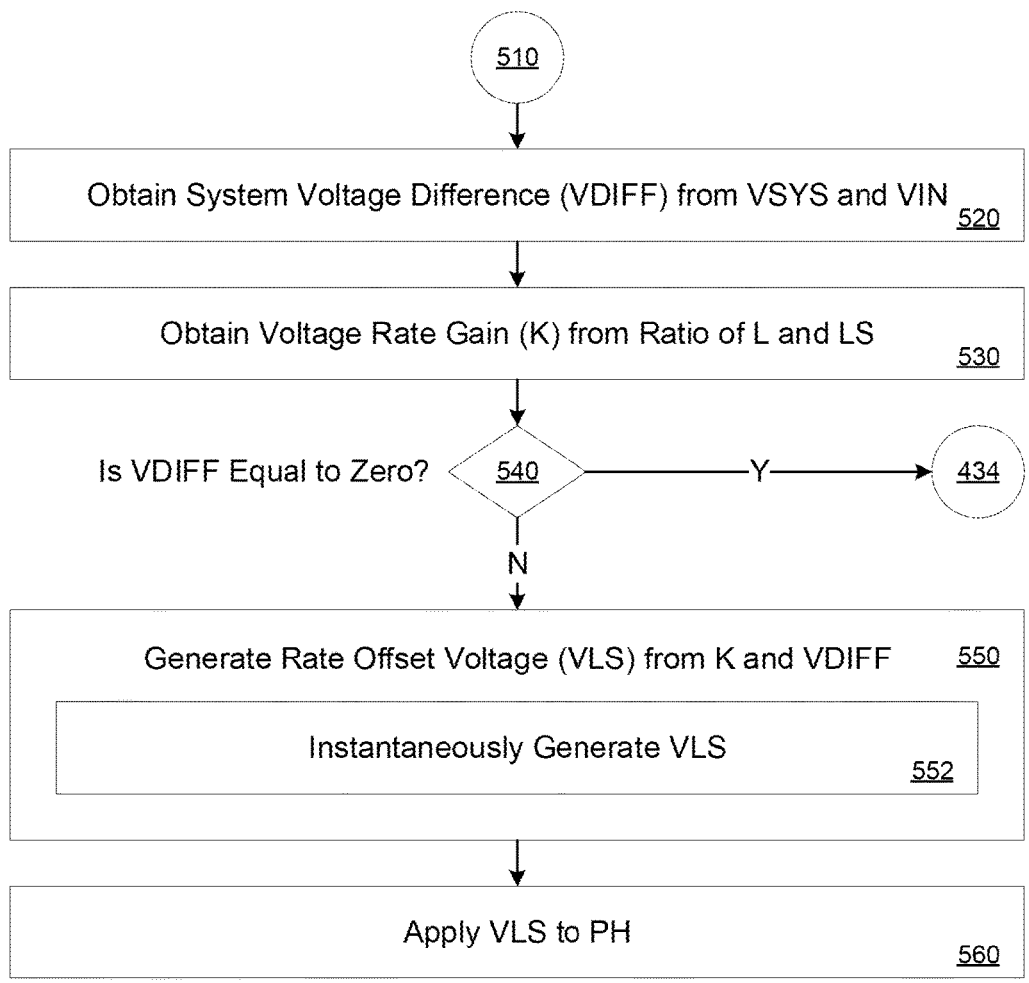
FIG. 5 illustrates an example method of compensating a phase comparator voltage further to the method of FIG. 4, in accordance with present implementations.

FIG. 5 illustrates an example method of compensating a phase comparator voltage further to the method of FIG. 4, in accordance with present implementations. In some implementations, at least one of the example system 100 and the example device 200 performs method 500 according to present implementations. In some implementations, the method 500 begins at step 510. The method 500 then continues to step 520.

At step 520, the example system obtains a system voltage difference VDIFF from a system voltage VSYS and an input voltage VIN. In some implementations, the system voltage comparator 230 generates the system voltage difference VDIFF. In some implementations, the rate predictor 250 also generates the system voltage difference VDIFF independently of the system voltage comparator 230. The method 500 then continues to step 530.

At step 530, the example system obtains a voltage rate gain K from a ratio of L and LS. In some implementations, the rate predictor 250 obtains the gain K from a programming operation to set a value of the rate gain at a memory device, element, region, or the like, thereof. In some implementations, the rate predictors obtains the gain K from a value stored therewith, in response to a programming, setting, or the like of the value at manufacturing time of the example system or during a diagnostic, testing, debugging, or like operation of the example system. The method 500 then continues to step 540. At step 540, the example system determines whether the voltage difference VDIFF is equal to zero. In some implementations, the rate predictor 250 determines whether the voltage difference VDIFF is equal to zero. In accordance with a determination that the voltage difference VDIFF is equal to zero, the method 500 continues to step 434. Alternatively, in accordance with a determination that the voltage difference VDIFF is not equal to zero, the method 500 continues to step 550.

At step 550, the example system generates a rate offset voltage VLs based at least partially the voltage rate gain K and the voltage difference VDIFF. In some implementations, the rate predictor 250 generates the rate offset voltage VLs based on the voltage rate gain K stored therewith and the voltage difference VDIFF detected thereby. In some implementations, step 550 includes step 552. At step 552, the example system instantaneously generates the rate offset voltage VLs. In some implementations, the rate predictor 250 instantaneously generates the rate offset voltage VLs upon change of input voltage or system voltage levels. The method 500 then continues to step 560. At step 560, the example system applies the rate offset voltage VLs to the phase comparator. In some implementations, the compensation generator 260 generates the output of the compensation generator 262 as an arithmetic sum of the outputs of the system voltage comparator 230, the magnitude compensator 240, and the rate predictor 250. In some implementations, the method 500 ends at step 560.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method of compensating a phase comparator voltage, the method comprising:
   obtaining an input voltage of a charger circuit and a system voltage of the charger;
   obtaining a voltage rate gain based on an aggregate inductance of the charger circuit; and
   in accordance with a determination that the input voltage and the system voltage are not equal, generating a rate offset voltage based on the voltage rate gain and the system voltage difference.

2. The method of claim 1, wherein the voltage rate gain is based on a ratio of an inductance of an inductor of the charger circuit and a parasitic inductance of a high-side inductor transistor of the charger circuit.

3. The method of claim 1, wherein the voltage rate gain has a predetermined value.

4. The method of claim 1, wherein the generating the rate offset voltage comprises generating the rate offset voltage in response to a change in the system voltage.

5. The method of claim 1, wherein the generating the rate offset voltage comprises generating the rate offset voltage instantaneously in response to a change in the system voltage.

6. The method of claim 1, further comprising:
   in accordance with a determination that an inductor voltage across an inductor of the charger circuit is substantially 0 V at a time satisfying a deactivation time threshold, generating an offset voltage having a predetermined magnitude.

7. The method of claim 6, wherein the deactivation time threshold is before a deactivation time of a high-side inductor transistor of the charger circuit, and the predetermined magnitude is negative.

8. The method of claim 6, wherein the deactivation time threshold is after a deactivation time of a high-side inductor transistor of the charger circuit, and the predetermined magnitude is positive.

9. The method of claim 6, further comprising:
   aggregating the system voltage difference, the rate offset voltage and the offset voltage into a compensation voltage.

10. The method of claim 9, further comprising:
    applying the compensation voltage to the charger circuit to maintain operation of the charger circuit in a discontinuous conduction mode.

11. A phase comparator device, comprising:
    a rate predictor device operatively coupled to an input voltage node and a system voltage node, and configured to obtain an input voltage of a power converter circuit and a system voltage of the power converter circuit, configured to obtain a voltage rate gain based on an aggregate inductance of the power converter circuit, and configured to, in accordance with a determination that the input voltage and the system voltage are not equal, generate a rate offset voltage based on the voltage rate gain and the system voltage difference.

12. The device of claim 11, wherein the voltage rate gain is based on a ratio of an inductance of an inductor of the charger circuit and a parasitic inductance of a high-side inductor transistor of the charger circuit.

13. The device of claim 11, wherein the rate predictor is further configured to store the voltage rate gain as a predetermined value in a nonvolatile memory therewith.

14. The device of claim 11, wherein the rate predictor is further configured to generate the rate offset voltage in response to a change in the system voltage.

15. The device of claim 11, wherein the rate predictor is further configured to generate the rate offset voltage instantaneously in response to a change in the system voltage.

16. The device of claim 11, wherein the rate predictor is further configured, in accordance with a determination that an inductor voltage across an inductor of the charger circuit is substantially 0 V at a time satisfying a deactivation time threshold, to generate an offset voltage having a predetermined magnitude.

17. The device of claim 16, wherein the deactivation time threshold is before a deactivation time of a high-side inductor transistor of the charger circuit, and the predetermined magnitude is negative.

18. The device of claim 16, wherein the deactivation time threshold is after a deactivation time of a high-side inductor transistor of the charger circuit, and the predetermined magnitude is positive.

19. The device of claim 16, further comprising:
a compensation generator operatively coupled to the rate predictor and configured to aggregate the system voltage difference, the rate offset voltage and the offset voltage into a compensation voltage, and to apply the compensation voltage to the charger circuit to maintain operation of the charger circuit in a discontinuous conduction mode.

20. A phase comparator system, comprising:
a rate predictor device including a memory device and operatively coupled to an input voltage node and a system voltage node, and configured to obtain an input voltage of a power converter circuit and a system voltage of the power converter circuit, configured to obtain a voltage rate gain from the memory device based on an aggregate inductance of the power converter circuit, and configured to, in accordance with a determination that the input voltage and the system voltage are not equal, generate a rate offset voltage based on the voltage rate gain and the system voltage difference; and
a compensation generator having a rate offset input operatively coupled to the rate predictor device and configured to receive the rate offset voltage at the rate offset input.

* * * * *